United States Patent
Schamber et al.

(10) Patent No.: US 11,223,210 B2
(45) Date of Patent: *Jan. 11, 2022

(54) UTILITY METER FOR USE WITH DISTRIBUTED GENERATION DEVICE

(71) Applicant: Landis+Gyr Innovations, Inc., Alpharetta, GA (US)

(72) Inventors: Steven John Schamber, Lafayette, IN (US); Prasanna Venkatesan, Duluth, GA (US)

(73) Assignee: Landis+Gyr Innovations, Inc., Alpharetta, GA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/023,059

(22) Filed: Sep. 16, 2020

(65) Prior Publication Data

US 2020/0412129 A1    Dec. 31, 2020

Related U.S. Application Data

(63) Continuation of application No. 15/606,314, filed on May 26, 2017, now Pat. No. 10,998,731.

(Continued)

(51) Int. Cl.
*H02J 3/46* (2006.01)
*H02J 3/38* (2006.01)
(Continued)

(52) U.S. Cl.
CPC ............ *H02J 3/46* (2013.01); *G01D 4/002* (2013.01); *G01R 22/063* (2013.01); *G01R 22/10* (2013.01);
(Continued)

(58) Field of Classification Search
CPC .. G01R 22/06; G01R 22/10; H02J 3/38; H02J 3/46
(Continued)

(56) References Cited

U.S. PATENT DOCUMENTS 4,463,311 A    7/1984 Kobayashi
4,977,482 A    12/1990 Langdon et al.
(Continued)

FOREIGN PATENT DOCUMENTS

CN    1403825 A    3/2003
CN    201467023 U    5/2010
(Continued)

OTHER PUBLICATIONS

U.S. Appl. No. 15/606,314, Corrected Notice of Allowability, dated Sep. 30, 2020, 6 pages.
(Continued)

*Primary Examiner* — Toan T Vu
(74) *Attorney, Agent, or Firm* — Kilpatrick Townsend & Stockton LLP

(57) ABSTRACT

An integrated metering device allows a resource provider to control the output of a distributed generation device onto a resource distribution network or grid. The integrated metering device may include a communications module, a metrology module, an inverter and regulator device, and a transfer switch. A resource provider may communicate with the integrated metering device via the communications module and may control the inverter and regulator device or the transfer switch. The metrology module may monitor the energy provided by the distributed generation device to the grid and may send information about the generated energy to the resource provider via the communications module.

20 Claims, 5 Drawing Sheets

Related U.S. Application Data

(60) Provisional application No. 62/342,005, filed on May 26, 2016.

(51) Int. Cl.
*G01R 22/06* (2006.01)
*G01R 22/10* (2006.01)
*G01D 4/00* (2006.01)

(52) U.S. Cl.
CPC .............. *H02J 3/381* (2013.01); *Y02B 70/34* (2013.01); *Y02B 90/20* (2013.01); *Y04S 20/30* (2013.01)

(58) Field of Classification Search
USPC ........................................................ 307/52
See application file for complete search history.

(56) References Cited

U.S. PATENT DOCUMENTS

| | | | |
|---|---|---|---|
| 5,572,396 | A | 11/1996 | Robinson |
| 6,188,145 | B1 | 2/2001 | Stewart |
| 6,420,801 | B1 | 7/2002 | Seefeldt |
| 7,274,305 | B1 | 9/2007 | Luttrell |
| 7,298,134 | B2 | 11/2007 | Weikel et al. |
| 7,648,389 | B1 | 1/2010 | Scott et al. |
| 8,049,642 | B2 | 11/2011 | Makinson et al. |
| 8,207,865 | B2 | 6/2012 | Kopp et al. |
| 8,212,687 | B2 | 7/2012 | Makinson et al. |
| 8,784,130 | B2 | 7/2014 | Scott et al. |
| 9,088,182 | B2 | 7/2015 | Kuniyosi et al. |
| 9,318,861 | B2 | 4/2016 | Fulton et al. |
| 9,391,414 | B2 | 7/2016 | Seals |
| 9,437,986 | B2 | 9/2016 | Knauer et al. |
| 9,484,653 | B1 | 11/2016 | Chen |
| 9,595,815 | B2 | 3/2017 | Knauer et al. |
| 9,620,305 | B2 | 4/2017 | Miller et al. |
| 9,627,861 | B2 | 4/2017 | Cruz |
| 9,995,768 | B2 | 6/2018 | Parks et al. |
| 10,132,838 | B2 | 11/2018 | Parks et al. |
| 10,998,731 | B2 * | 5/2021 | Schamber .............. G01D 4/002 |
| 2002/0075622 | A1 | 6/2002 | Robinson |
| 2002/0171436 | A1 | 11/2002 | Russell |
| 2003/0034693 | A1 | 2/2003 | Wareham et al. |
| 2004/0036362 | A1 | 2/2004 | Beck et al. |
| 2005/0027464 | A1 | 2/2005 | Jonker et al. |
| 2008/0091625 | A1 | 4/2008 | Kremen |
| 2009/0121705 | A1 | 5/2009 | Rzehak |
| 2010/0003848 | A1 | 1/2010 | Scott et al. |
| 2010/0105226 | A1 | 4/2010 | Gong et al. |
| 2010/0225305 | A1 | 9/2010 | Reineccius |
| 2010/0306027 | A1 | 12/2010 | Haugh |
| 2013/0106397 | A1 | 5/2013 | Fulton et al. |
| 2013/0123997 | A1 | 5/2013 | King et al. |
| 2013/0211754 | A1 | 8/2013 | Herzog et al. |
| 2013/0226485 | A1 | 8/2013 | Pietrowicz et al. |
| 2014/0127935 | A1 | 5/2014 | Scott et al. |
| 2014/0218010 | A1 | 8/2014 | Fulton et al. |
| 2015/0061644 | A1 | 3/2015 | Parks et al. |
| 2015/0233980 | A1 | 8/2015 | Umetsu et al. |
| 2015/0285844 | A1 | 10/2015 | May |
| 2015/0309075 | A1 | 10/2015 | Parks et al. |
| 2016/0056571 | A1 | 2/2016 | Hamaoka et al. |
| 2016/0061870 | A1 | 3/2016 | Vaculik et al. |
| 2016/0141784 | A1 | 5/2016 | Hashiguchi |
| 2016/0181752 | A1 | 6/2016 | Parks et al. |
| 2016/0320427 | A1 | 11/2016 | Bautista et al. |
| 2016/0380413 | A1 | 12/2016 | Cruz |
| 2017/0168516 | A1 | 6/2017 | King |
| 2017/0212160 | A1 | 7/2017 | Fulton et al. |
| 2017/0214225 | A1 | 7/2017 | Ramachandran et al. |
| 2017/0229827 | A1 | 8/2017 | Michelmann et al. |
| 2017/0346296 | A1 | 11/2017 | Schamber et al. |
| 2018/0109047 | A1 | 4/2018 | Hoang et al. |
| 2018/0246150 | A1 | 8/2018 | Cook |
| 2020/0225263 | A1 | 7/2020 | Karlgaard |

FOREIGN PATENT DOCUMENTS

| | | |
|---|---|---|
| CN | 201623651 U | 11/2010 |
| CN | 101976854 A | 2/2011 |
| CN | 202110217 U | 1/2012 |
| CN | 102882237 A | 1/2013 |
| CN | 103138291 A | 6/2013 |
| CN | 103187735 A | 7/2013 |
| CN | 203368046 U | 12/2013 |
| CN | 103545926 A | 1/2014 |
| CN | 105242087 A | 1/2016 |
| CN | 103645363 B | 9/2016 |
| FR | 3002642 A1 | 8/2014 |
| JP | H06-153527 A | 5/1994 |
| JP | 2001-090296 A | 4/2001 |
| JP | 2011204045 A | 10/2011 |
| JP | 2012-228043 A | 11/2012 |
| JP | 2012-244665 A | 12/2012 |
| JP | 2014-230454 A | 12/2014 |
| WO | 2003/014748 A1 | 2/2003 |
| WO | 2003014748 A1 | 3/2003 |
| WO | 2011/124657 A1 | 10/2011 |
| WO | 2013057516 A1 | 12/2013 |
| WO | 2014-002798 A1 | 1/2014 |
| WO | 2014-192015 A2 | 12/2014 |
| WO | 2017/205724 A1 | 11/2017 |

OTHER PUBLICATIONS

Japanese Patent Application No. 2018-560877, Office Action, dated May 18, 2021, 10 pages.
U.S. Appl. No. 15/606,314, Notice of Allowance, dated Mar. 17, 2021, 9 pages.
Chinese Patent Application No. 201780031374.1, Office Action, dated Mar. 22, 2021, 26 pages.
"Conzerv EM6438_EM6436 Dual Source Energy Meters User Manual", Available online at: https://download.schneider-electric.com/files7p_enDocType=User+guide&p_File_Name=NHA12537-03.pdf&p%20Doc%20Ref=NHA12537, Dec. 31, 2015, 76 pages.
"Recreational Vehicle Park", Milbank Manufacturing, Electrical Products & Accessories, Product Sheet Available at: https://www.milbankworks.com/getmedia/24191e24-6c65-4ffb-a468-9c98e6ec6f68/Recreational-Vehicle-Park-Electrical-Products.pdf, Apr. 2019, 32 pages.
Australian Patent Application No. 2017271591, First Examination Report, dated Nov. 19, 2020, 3 pages.
European Patent Application No. 17729293.5, Office Action, dated Dec. 15, 2020, 6 pages.
PCT Patent Application No. PCT/US2020/053512, International Search Report and Written Opinion, dated Jan. 19, 2021, 10 pages.
PCT Patent Application No. PCT/US2020/054422, International Search Report and Written Opinion, dated Jan. 18, 2021, 12 pages.
"Unpublished U.S. Appl. No. 16/428,118, filed May 31, 2019.", In accordance with the Waiver of the Copy Requirements in 37 CFR 1.98 for Cited Pending U.S. Patent Applications, 1287 O.G. 163 (Oct. 19, 2004), 17 pages.
Office Action, Chinese Patent Application No. 201780031374.1, dated Jul. 3, 2020, 32 pages.
International Search Report and Written Opinion, PCT Patent Application No. PCT/US2017/034653, dated Aug. 10, 2017, 12 pages.
International Search Report and Written Opinion, PCT Patent Application No. PCT/US2020/012485, dated Apr. 20, 2020, 12 pages.
"Unpublished U.S. Appl. No. 16/793,876, filed Feb. 18, 2020.", In accordance with the Waiver of the Copy Requirements in 37 CFR 1.98 for Cited Pending U.S. Patent Applications, 1287 O.G. 163 (Oct. 19, 2004), 32 pages.
"Unpublished U.S. Appl. No. 16/836,244, filed Mar. 31, 2020.", In accordance with the Waiver of the Copy Requirements in 37 CFR 1.98 for Cited Pending U.S. Patent Applications, 1287 O.G. 163 (Oct. 19, 2004), 46 pages.
U.S. Appl. No. 15/606,314, Non-Final Office Action, dated Apr. 29, 2020, 14 pages.

(56) References Cited

OTHER PUBLICATIONS

U.S. Appl. No. 15/606,314 , Notice of Allowance, dated Jul. 10, 2020, 9 pages.
Office Action, Chinese Patent Application No. 201780031374.1, dated Jul. 21, 2021, 23 pages.

\* cited by examiner

US 11,223,210 B2

UTILITY METER FOR USE WITH DISTRIBUTED GENERATION DEVICE

RELATED APPLICATIONS

This application claims priority to U.S. Ser. No. 15/606,314, filed May 26, 2017 and entitled Utility Meter for Use with Distributed Generation Device, which claims priority to U.S. Ser. No. 62/342,005, filed May 26, 2016 and entitled Utility Meter for Use with Distributed Generation Device, both of which are incorporated herein by reference.

FIELD OF THE INVENTION

The present invention relates to a utility meter and in particular to an integrated utility metering device that controls the flow of power from a distributed generation device onto a resource distribution grid.

BACKGROUND

An electric utility manages a distribution grid that delivers power to its customers. Typically, a meter is located at the customer's premises which measures and controls the electricity delivered to the premises via the grid. The meter may be combined with a communications module so that the meter can communicate with other meters and with the utility. The communications module may communicate via RF, cellular, PLC or any other suitable communications technology.

In addition to delivering power, the grid may also accept power generated by devices at customer premises, such as that generated by solar panels, wind mills, water turbines, and generators, collectively referred to herein as distributed generation devices. Currently, the devices used to connect these distributed generation devices to the grid are separate and distinct from the utility meter located at the customer premises. They require additional installation and wiring and increase the complexity of the connections to the grid. The utility may not have the ability to control the distributed generation devices or their connections to the grid, which makes it challenging to manage the grid.

SUMMARY

An integrated metering device integrates the functions of an inverter and regulator device, a transfer switch, a utility meter, and a distributed generation meter into a single device. The integrated metering device includes a communications module, a metrology module, an inverter and regulator device, and a transfer switch. The output of a distributed generation device, such as a solar panel or generator, is connected to an input of the integrated metering device. The inverter and regulator device processes the output from the distributed generation device so that it meets the requirements of the grid. A transfer switch controls the flow of energy generated by the distributed generation device onto the utility grid.

The metrology module may include a single metering device or multiple metering devices. The metrology module may monitor the flow of energy to and from the grid, monitor the characteristics of the energy provided by the distributed generation device, and control the transfer switch. The communications module may receive communications via a network that include instructions for controlling the inverter and regulator, the transfer switch, or the metrology module. The communications module may transmit information related to the operation of the integrated metering device and the measurements taken by the metrology module to other devices on the network or a central system.

These illustrative aspects and features are mentioned not to limit or define the invention, but to provide examples to aid understanding of the inventive concepts disclosed in this application. Other aspects, advantages, and features of the present invention will become apparent after review of the entire application.

DETAILED DESCRIPTION

The invention provides an integrated metering device that allows a resource provider to control the output of a distributed generation device onto a resource distribution network or grid. The integrated metering device may include a communications module and a metrology module, as well as an inverter and regulator device and a transfer switch. A resource provider may communicate with the integrated metering device via the communications module and may control the inverter and regulator device or the transfer switch. The metrology module may monitor the energy provided by the distributed generation device to the grid and may send information about the generated energy to the resource provider via the communications module. The integrated metering device simplifies on-site wiring, enhances safety, provides one point of utility communications and control, and prevents fraudulent connection of non-approved distributed generation devices.

Exemplary Operating Environment

Figure 1:
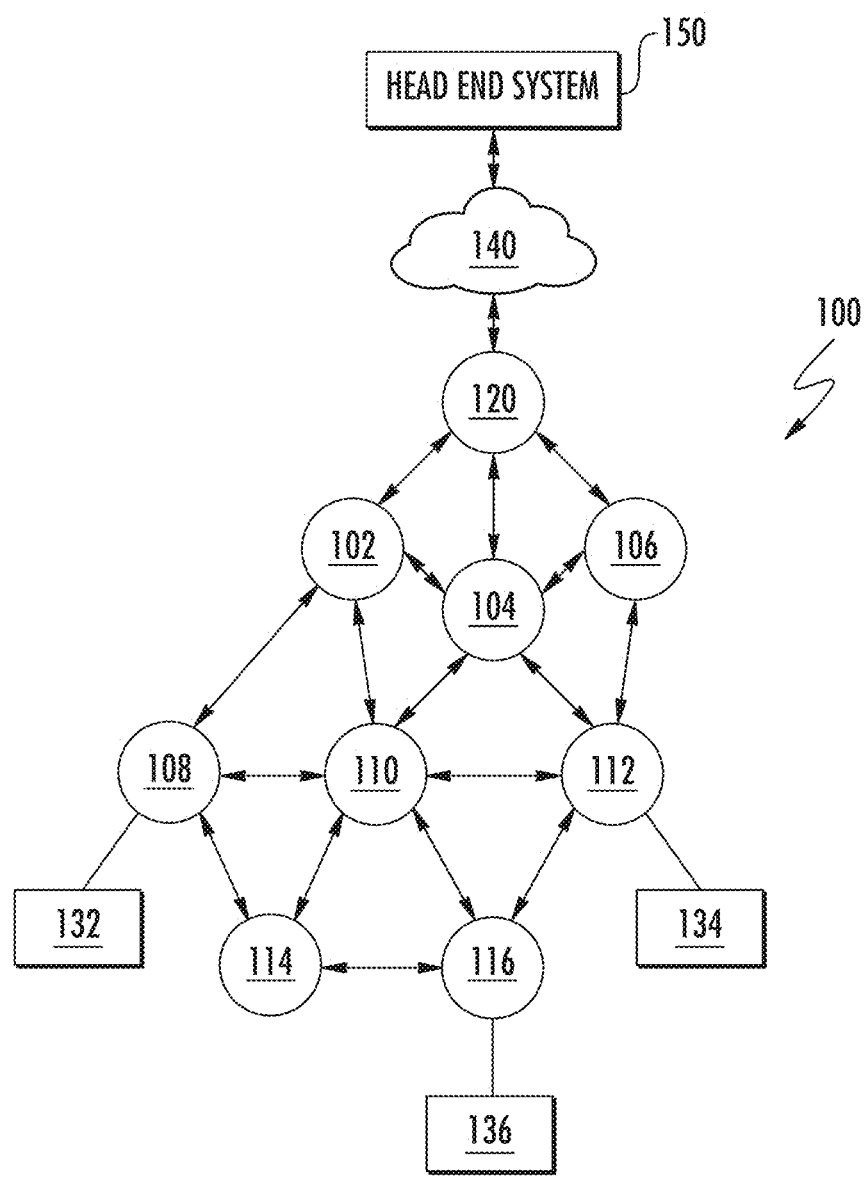
FIG. 1 illustrates an exemplary network of metering devices, including integrated metering devices.

FIG. 1 illustrates an exemplary operating environment for an integrated metering device. A network 100, such as a wireless mesh network, includes a number of nodes, 102-116, 120. Each nodes 102-116 may include a metrology module for measuring resource consumption at a customer premises. The nodes may also include a communications module for communicating on the network using RF, cellular, PLC or any other suitable communications technology. Some of the nodes, 108, 112, 116 may be associated with an integrated metering device that controls the entry of a resource generated by a distributed generation device 132, 134, 136 onto a utility grid (not shown) in addition to measuring consumption and communicating on the network. One example is the entry of electric energy onto the electric grid. FIG. 1 illustrates that node 120 may further communicate with other devices via network 140. In one implementation node 120 communicates with a head end system 150.

Integrated Metering Device

Figure 2:
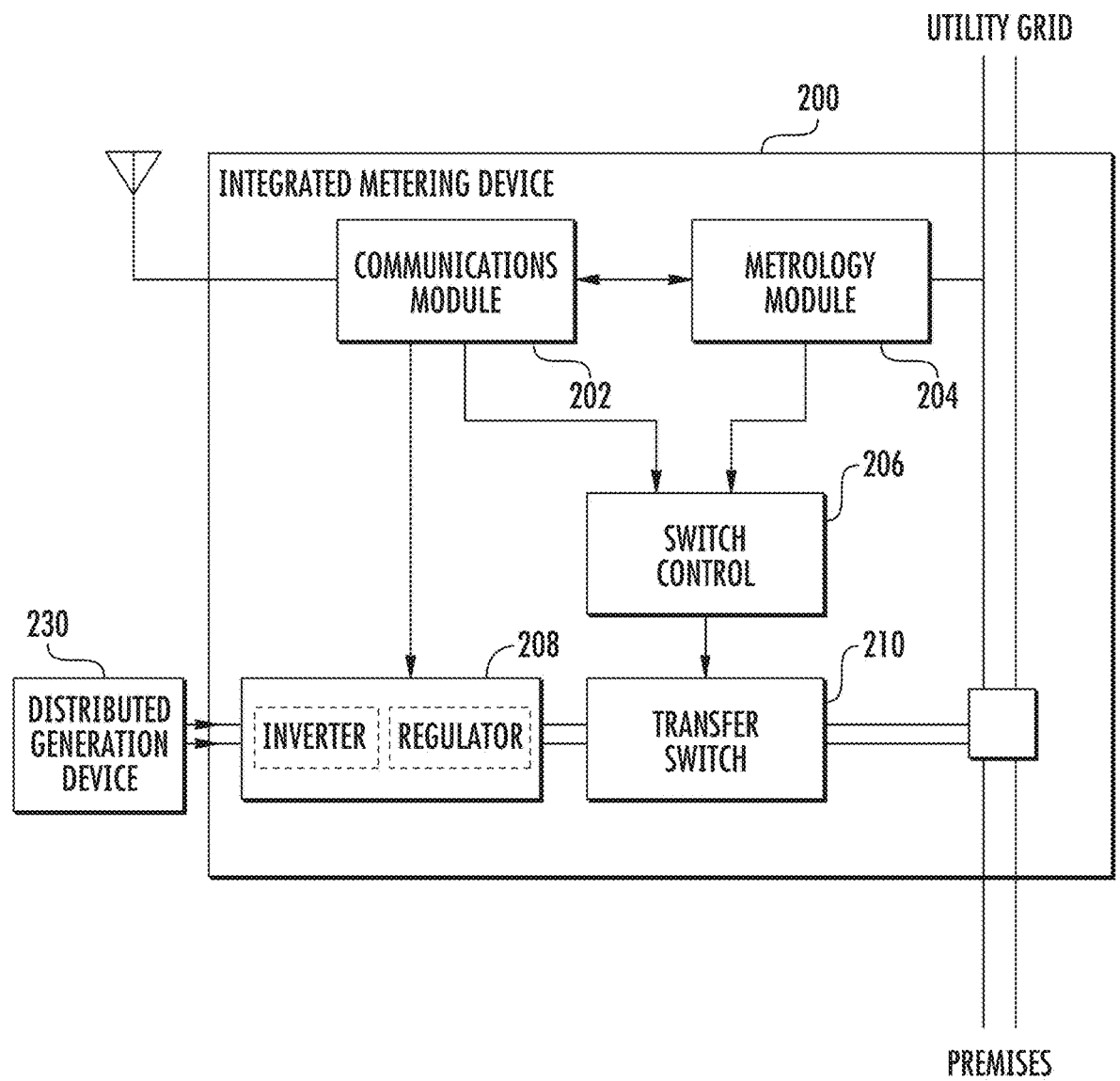
FIG. 2 illustrates an exemplary integrated metering device for connecting a distributed generation device.

FIG. 2 illustrates an exemplary integrated metering device 200 for use with a utility grid. The integrated metering device 200 connects the customer's premises to the grid and also connects a distributed generation device 230, such as an array of solar panels, to the grid. The integrated metering device integrates the functions of an inverter and regulator device, a transfer switch, a utility meter, and a distributed generation meter into a single device.

The output of the distributed generation device 230 is connected to an input of the integrated metering device 200. The output may be connected directly to the integrated metering device or may be connected to a separate connector provided in an electric meter socket to which the integrated meter is connected. For example, the output of the distributed generation device may be a DC inverter output from an array of solar panels or an AC output from an AC generator. The integrated meter is designed so that the output of the distributed generation device may be connected after the integrated meter is installed and properly secured.

Figure 4:
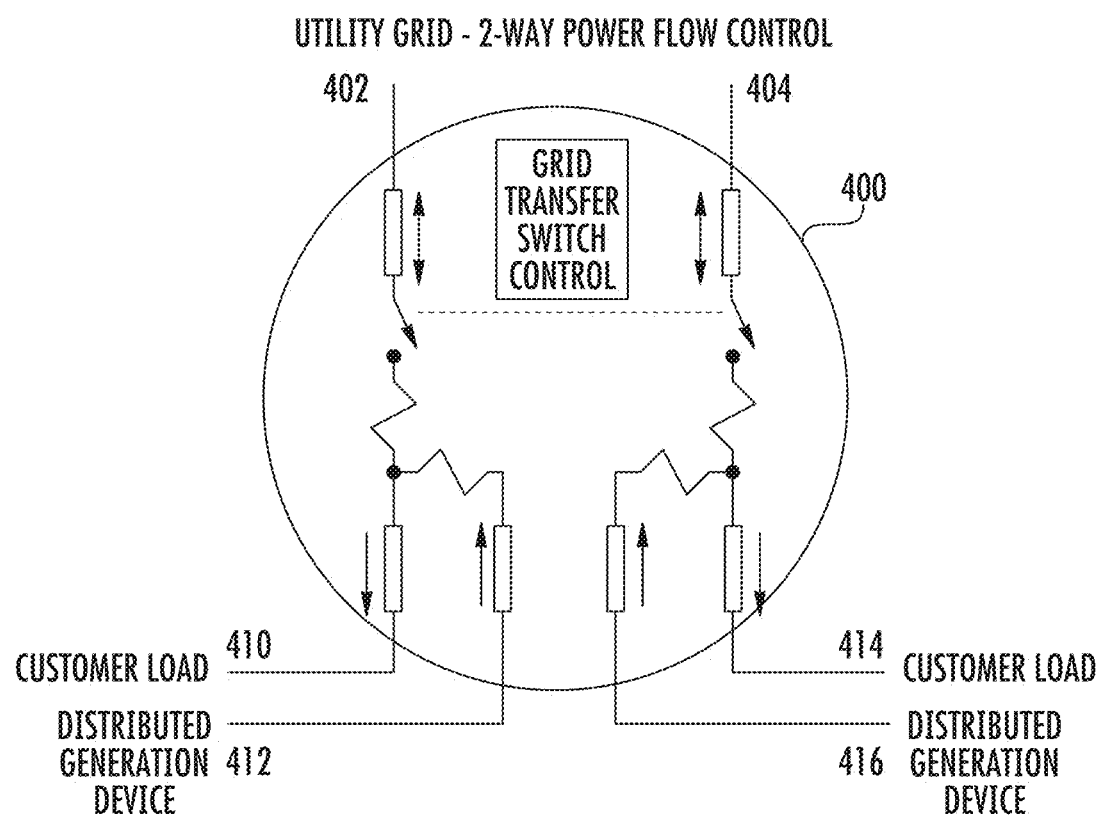
FIG. 4 illustrates exemplary connections to an integrated metering device.
Figure 5:
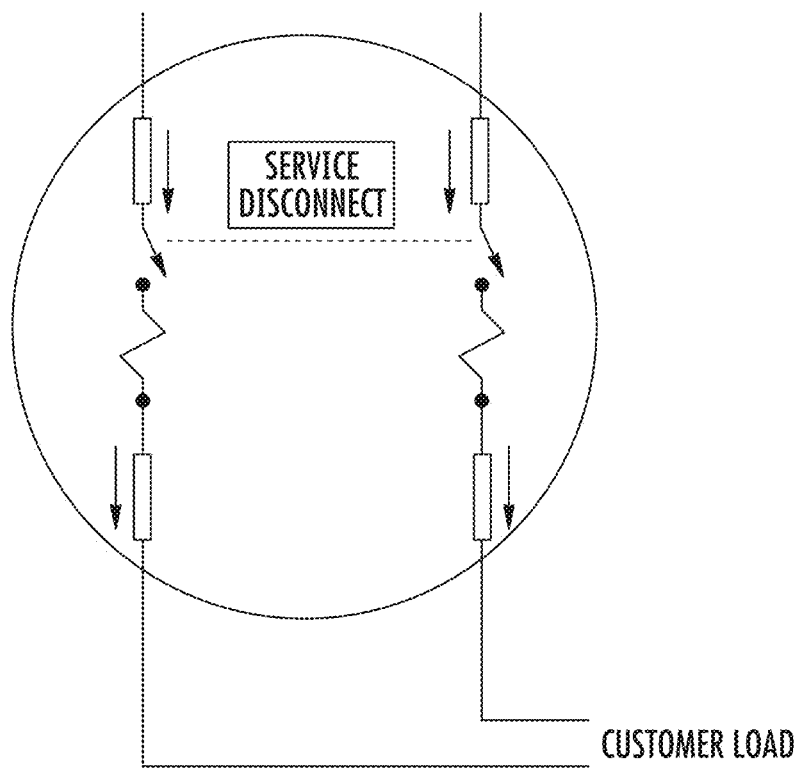
FIG. 5 illustrates connections for a prior art system meter.

FIG. 4 illustrates a portion of an exemplary integrated metering device that includes terminals 412, 416 for connecting the distributed generation device and terminals 410, 414 for connecting to the customer premises or load. Terminals 402 and 404 connect to the utility grid. The integrated metering device shown in FIG. 4 is similar to an ANSI Form 2S meter, such as shown in FIG. 5, but it includes additional terminals and circuitry for connecting to the distributed generation device. Note that FIG. 4 does not illustrate all of the components of the integrated metering device.

The inverter and regulator device 208 of the integrated metering device processes the output from the distributed generation device so that it meets the requirements of the grid. For example, the inverter and regulator device may convert a DC output to AC, adjust the phase of the output, or regulate the output voltage to meet the requirements of the grid. The output of the inverter and regulator device 208 is provided to a transfer switch 210. The transfer switch 210 connects the output of the distributed generation device to the utility grid. The transfer switch also prevents back feed power from the distributed generation device from entering the grid in the case of a power outage. During a power outage, back feed power may present a safety hazard to utility workers restoring power due to downed lines. Although FIG. 2 illustrates that the transfer switch is located between the inverter and regulator device and the grid, it can be located elsewhere so long as it controls the flow of energy from the distributed generation device onto the grid.

The integrated metering device includes a metrology module 204 that provides metering functions. Exemplary metering functions includes monitoring energy provided by the distributed generation device to the utility grid, monitoring energy used by the premises, and monitoring net energy delivered to or received from the utility grid. The metrology module may include a single metering device or multiple metering devices. Metering information, including information on the energy generated by a distributed generation device, may be provided to the utility via the communications module or displayed on an output device of the meter, such as a display device. The metrology module may also monitor characteristics of the energy provided by the distributed generation device or the utility grid including, but not limited to, wattage, VARs, or VA, harmonics or total harmonic distortion. For example, FIG. 2 illustrates that the metrology module monitors the output of the transfer switch 210. The metrology module may control the transfer switch via switch control 206. For example, if the metrology module detects a loss of utility power, the metrology module may control the transfer switch to prevent power from the distributed generation device from entering the grid.

The metrology module may also control components of the inverter and regulator device. Exemplary actions include the following. If the metrology module senses an overvoltage or under-voltage condition, the metrology module may raise or lower the output voltage from the inverter to control the voltage. If the metrology module senses the voltage is over or under a configurable limit, the metrology module may disconnect from the grid. The metrology module may also disconnect the customer load if the voltage is over or under configurable limits for the load. The metrology module may use configurable limits for the amperage supplied by the distributed generation device so that if the amperage supplied by the distributed generation device exceeds the limit for supplying the grid or the load, the metrology device may limit the amperage or shut down the distributed generation device.

The integrated metering device also includes communications module 202. The communications module may communicate with another device on the network, such as a neighboring meter or a collector. The communications module may transmit information regarding the energy provided by the distributed generation device to the utility grid, the energy used by the premises, the net energy delivered to or received from the utility grid, the status of the device, or other information to the utility or to other devices on the network. The communications module may receive communications from the utility via the network that include instructions for controlling the inverter and regulator, the transfer switch, or the metrology module. In one example, a head end system sends the instructions to the communications module and the communications module controls the inverter, regulator, or switch components to control the power provided by the distributed generation device to the grid.

The communications module may control the inverter and regulator device. In some instances, the control is based on an instruction received by the communications module. Exemplary instructions received by the communications module include the following:

Set Regulator Configuration (Specify regulator minimum and maximum output voltage, maximum output current limit, minimum grid voltage and duration time before opening the transfer switch)

Get Regulator Configuration

Get Regulator Status (Regulator inverter input voltage, grid output voltage, operation health status, voltage and current limit status, transfer switch status)

Get Regulator Event History

Clear Regulator Event History

Distributed Energy Response (DER) Event—Limit current back onto the grid to predefined DER limit. Communications module may communicate to the regulator as well as to local intelligent load control switches on the premises or to a group of load control switches and other inverters that make up a local micro-grid to limit the energy back onto the grid within a predefined DER limit.

The communications module and the metrology module of the integrated metering device may include one or more processing devices and memory. The processing devices may execute computer-executable instructions stored on computer-readable media or access information stored on computer-readable media to perform the operations described herein. Although the communications module and the metrology module are shown as separate modules in FIG. 2, the modules may be combined or may be combined with other components of the integrated metering device. Other implementations of the integrated metering device may use different or additional modules and components than those illustrated in FIG. 2. For example, in one implementation the metrology module includes three metering devices. One metering device is associated with the inverter and regulator device, a second metering device is associated with the premises load, and a third metering device is a NET metering device that measures the NET energy delivered to/received from the utility grid (e.g., difference between the energy measured at the inverter and regulator device and the energy consumed by the premises load). Each metering device may provide voltage, current, watt-hours, volt-amps, volt-amp-reactive or other measured parameter. In some implementations, the inverter and regulator device may include only an inverter or only a regulator depending upon the type of distributed generation device.

The communications module and the metrology module may control other components of the integrated metering device via wired or wireless connections.

The housing for the integrated metering device may provide enhanced thermal management since the inverter and regulator components may dissipate more heat than the components of a conventional utility meter. Housings for conventional utility meters typically use plastic or glass, which are poor heat conductors. The housing for the integrated metering device may include metal and may include metal fins to handle the additional heat. In one example the housing includes aluminum fins.

Figure 3:
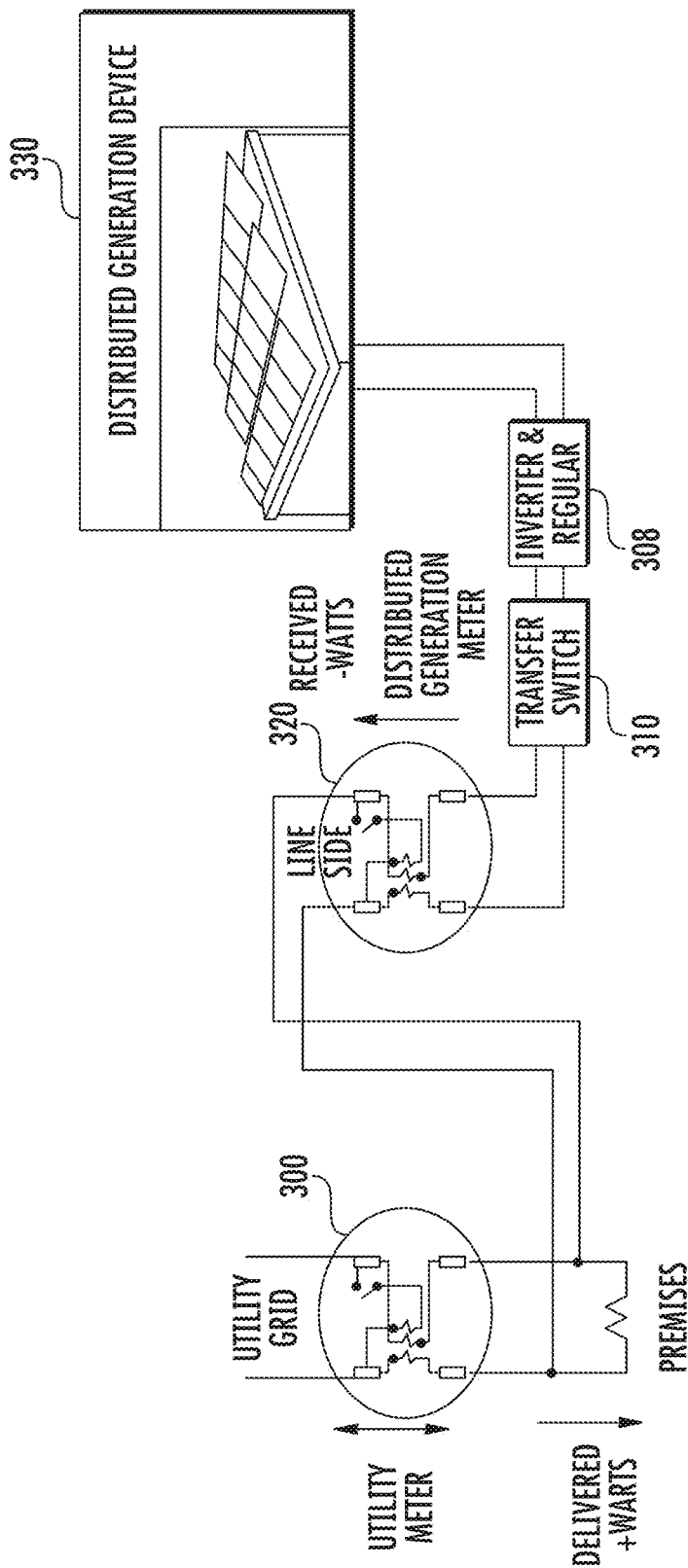
FIG. 3 illustrates a prior art system for connecting a distributed generation device.

The ability to remotely control the power provided by the distributed generation device by controlling components located at the premises is an improvement over the prior art. FIG. 3 illustrates a prior art system that includes two meters. A utility meter 300 is connected between the utility grid and the customer premises and a separate distributed generation meter 320 is connected between the distributed generation device and the utility meter.

The output of the distributed generation device 330 is connected to the inverter and regulator device 308. The output of the inverter and regulator device 308 is connected to the transfer switch 310. The transfer switch is also connected to the distributed generation meter 320. Control of the inverter and regulator device 308 may be wired or wireless and may include controlling components within the device to meet voltage and current set points and limits. The output of the distributed generation meter 320 is connected to the premises side of the utility meter 300. The utility meter 300 is connected to the utility grid and the premises.

A head end system cannot communicate with the inverter and regulator device of FIG. 3. Although the head end system may send instructions to a communications module located in the utility meter 300, the communications module cannot provide instructions or otherwise control the inverter and regulator device or the transfer switch. The configuration shown in FIG. 3 requires more physical space and is generally more expensive due to the need for more equipment and additional labor. There is also a greater risk of tampering or improper wiring.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method for operating an integrated metering device, comprising:
   connecting, by the integrated metering device, a utility grid, a premises load, and a distributed generation device by providing a grid interface for connecting to the utility grid, a premises interface for connecting to the premises load, and a distributed generation device interface for connecting to the distributed generation device;
   monitoring, by a metrology module, energy delivered to the premises interface from the grid interface;
   receiving, by the distributed generation device interface, an output of the distributed generation device;
   processing, by an inverter and regulator device, the output of the distributed generation device and providing a processed output from the inverter and regulator device to a transfer switch;
   controlling, by the metrology module, the transfer switch to provide the processed output to the grid interface;
   monitoring, by the metrology module, energy delivered to the grid interface from the transfer switch, and providing information on the energy delivered to the grid interface from the transfer switch to a communications module; and
   communicating, by the communications module, a communication via an external network that includes the information on the energy delivered to the grid interface from the transfer switch,
   wherein the inverter and regulator device, the transfer switch, the metrology module, and the communication module are located within a housing of the integrated metering device.

2. The method of claim 1, wherein monitoring, by a metrology module, energy delivered to the grid interface from the transfer switch, comprises monitoring at least one characteristic of the energy related to wattage, VARs, VA, harmonics, or total harmonic distortion.

3. The method of claim 1, wherein monitoring, by a metrology module, energy delivered to the grid interface from the transfer switch, comprises monitoring a voltage and based on the voltage controlling an output voltage of an inverter component within the inverter and regulator device.

4. The method of claim 1, further comprising:
   receiving, by the communications module, an instruction via the external network; and
   controlling, by the communications module, the inverter and regulator device based on the instruction.

5. The method of claim 4, wherein the instruction relates to a distributed energy response event, further comprising:
   communicating, by the communication module, with local load control switches to limit an amount of energy delivered to the utility grid to a predefined limit.

6. The method of claim 1, wherein processing, by an inverter and regulator device, the output of the distributed generation device comprises making a phase adjustment so that a phase of the processed output is adjusted from a phase of the output of the distributed generation device.

7. The method of claim 1, further comprising:
   detecting, by the metrology module, a loss of utility power, and in response to detecting the loss of utility power, controlling the transfer switch to prevent power from the distributed generation device from entering the utility grid.

8. The method of claim 1, wherein the metrology module includes a first metering device associated with the inverter and regulator device, a second metering device associated with a premises load, and a third metering device that is a NET metering device, further comprising:

measuring, by the NET metering device, net energy delivered to or received from the utility grid.

9. A method for operating an integrated metering device, comprising:

connecting, by the integrated metering device, a utility grid, a premises load, and a distributed generation device by providing a grid interface for connecting to the utility grid, a premises interface for connecting to the premises load, and a distributed generation device interface for connecting to the distributed generation device;

monitoring, by a metrology module, energy delivered to the premises interface from the grid interface;

receiving, by the distributed generation device interface, an output of the distributed generation device;

processing, by an inverter and regulator device, the output of the distributed generation device and providing a processed output to a transfer switch;

controlling, by a communication module, the transfer switch to provide the processed output from the inverter and regulator device to the grid interface;

monitoring, by the metrology module, energy delivered to the grid interface, and providing information on the energy delivered to the grid interface to the communications module; and communicating, by the communications module, a communication via an external network that includes the information on the energy delivered to the grid interface, wherein the inverter and regulator device, the transfer switch, the metrology module, and the communication module are located within a housing of the integrated metering device.

10. The method of claim 9, wherein monitoring, by a metrology module, energy delivered to the grid interface, comprises monitoring at least one characteristic of the energy related to wattage, VARs, VA, harmonics, or total harmonic distortion.

11. The method of claim 9, wherein monitoring, by a metrology module, energy delivered to the grid interface, comprises monitoring a voltage and based on the voltage controlling an output voltage of an inverter component within the inverter and regulator device.

12. The method of claim 9, further comprising:

receiving, by the communications module, an instruction via the external network; and controlling, by the communications module, the inverter and regulator device based on the instruction.

13. The method of claim 12, wherein the instruction relates to a distributed energy response event, further comprising:

communicating, by the communication module, with local load control switches to limit an amount of energy delivered to the utility grid to a predefined limit.

14. The method of claim 9, wherein processing, by an inverter and regulator device, the output of the distributed generation device comprises making a phase adjustment so that a phase of the processed output is adjusted from a phase of the output of the distributed generation device.

15. The method of claim 9, further comprising:

detecting a loss of utility power; and controlling the transfer switch to prevent power from the distributed generation device from entering the utility grid.

16. An integrated metering device, comprising:

a housing;

a grid interface, wherein the grid interface includes a first plurality of terminals configured to connect the integrated metering device to a utility grid;

a premises interface; wherein the premises interface includes a second plurality of terminals configured to connect the integrated metering device to a premises load;

a distributed generation device interface, wherein the distributed generation device interface includes a third plurality of terminals configured to connect the integrated metering device to a distributed generation device;

a regulator connected to the distributed generation device interface;

a transfer switch connected to an output of the regulator and to the grid interface;

a metrology module for measuring energy delivered to the grid interface from the distributed generation device and energy delivered to the premises interface from the grid interface; and a communications module configured to receive instructions for controlling the regulator via an external network, wherein the regulator, the transfer switch, the metrology module and the communication module are located within the housing.

17. The integrated metering device of claim 16, further comprising:

an inverter connected between the distributed generation device interface and the regulator.

18. The integrated metering device of claim 17, wherein the metrology module includes a first metering device associated with the regulator and the inverter, a second metering device associated with the premises load, and a third metering device configured to measure net energy delivered to or received from the utility grid.

19. The integrated metering device of claim 16, wherein the communications module is further configured to receive an instruction via the external network and control the regulator based on the instruction.

20. The integrated metering device of claim 16, wherein the communications module is further configured to receive an instruction via the external network and control the transfer switch based on the instruction.

* * * * *